United States Patent [19]

Berlin

[11] Patent Number: 5,502,439
[45] Date of Patent: Mar. 26, 1996

[54] METHOD FOR COMPRESSION OF BINARY DATA

[75] Inventor: Gary J. Berlin, Beech Island, S.C.

[73] Assignee: The United States of America as represented by the United States Department of Energy, Washington, D.C.

[21] Appl. No.: 243,164

[22] Filed: May 16, 1994

[51] Int. Cl.⁶ .................................................. H03M 7/30
[52] U.S. Cl. .................................... 341/51; 341/106
[58] Field of Search ............................ 341/51, 63, 95, 341/106

[56] References Cited

U.S. PATENT DOCUMENTS

| | | | |
|---|---|---|---|
| 4,286,256 | 8/1981 | Langdon et al. | 340/347 |
| 4,464,650 | 8/1984 | Eastman et al. | 340/347 |
| 4,491,934 | 1/1985 | Heinz | 364/900 |
| 4,558,302 | 12/1985 | Welch | 340/347 |
| 4,586,027 | 4/1986 | Tsukiyama et al. | 340/347 |
| 4,622,545 | 11/1986 | Atkinson | 340/747 |
| 4,633,490 | 12/1986 | Goertzel et al. | 375/122 |
| 4,682,150 | 7/1987 | Mathes et al. | 340/347 |
| 4,814,746 | 3/1989 | Miller et al. | 341/95 |
| 4,872,009 | 10/1989 | Tsukiyama et al. | 341/95 |
| 4,876,541 | 10/1989 | Storer | 341/51 |
| 4,905,297 | 2/1990 | Langdon, Jr. et al. | 382/56 |
| 4,906,991 | 3/1990 | Fiala et al. | 341/51 |
| 4,941,193 | 7/1990 | Barnsley et al. | 382/56 |
| 4,943,869 | 7/1990 | Horikawa et al. | 358/426 |
| 4,955,066 | 9/1990 | Notenboom | 382/56 |
| 4,988,998 | 1/1991 | O'Brien | 341/55 |
| 5,001,477 | 3/1991 | Hicks et al. | 341/50 |
| 5,003,307 | 3/1991 | Whiting et al. | 341/51 |
| 5,010,345 | 4/1991 | Nagy | 341/65 |
| 5,049,881 | 9/1991 | Gibson et al. | 341/95 |
| 5,051,745 | 9/1991 | Katz | 341/51 |
| 5,065,447 | 11/1991 | Barnsley et al. | 382/56 |
| 5,109,433 | 4/1992 | Notenboom | 382/40 |
| 5,126,739 | 6/1992 | Whiting et al. | 341/106 |
| 5,140,321 | 8/1992 | Jung | 341/55 |
| 5,146,221 | 9/1992 | Whiting et al. | 341/67 |
| 5,150,430 | 9/1992 | Chu | 382/56 |
| 5,151,697 | 9/1992 | Bunton | 341/51 |
| 5,153,591 | 10/1992 | Clark | 341/51 |
| 5,155,484 | 10/1992 | Chambers, IV | 341/55 |
| 5,166,684 | 11/1992 | Juri et al. | 341/67 |
| 5,177,622 | 1/1993 | Yoshida et al. | 358/429 |
| 5,179,378 | 1/1993 | Raganathan et al. | 341/51 |
| 5,179,711 | 1/1993 | Vreeland | 395/775 |
| 5,185,820 | 2/1993 | Miyata | 382/56 |
| 5,206,742 | 4/1993 | Soga et al. | 358/427 |
| 5,210,536 | 5/1993 | Furlan | 341/107 |
| 5,212,565 | 5/1993 | Feintuch et al. | 358/433 |
| 5,212,742 | 5/1993 | Normile et al. | 382/56 |
| 5,229,768 | 7/1993 | Thomas | 341/51 |
| 5,237,675 | 8/1993 | Hannon, Jr. | 395/425 |
| 5,239,298 | 8/1993 | Wei | 341/51 |
| 5,245,427 | 9/1993 | Kunihiro | 358/133 |
| 5,245,441 | 9/1993 | Ruben | 358/426 |
| 5,250,949 | 10/1993 | Frost et al. | 341/200 |
| 5,254,990 | 10/1993 | Yoshida et al. | 341/51 |
| 5,271,071 | 12/1993 | Waite | 382/56 |
| 5,298,895 | 3/1994 | Van Maren | 341/51 |
| 5,363,098 | 11/1994 | Antoshenkov | 341/95 |

*Primary Examiner*—Marc S. Hoff
*Attorney, Agent, or Firm*—Brian Tumm; Harold Dixon; William R. Moser

[57] ABSTRACT

The disclosed method for compression of a series of data bytes, based on LZSS-based compression methods, provides faster decompression of the stored data. The method involves the creation of a flag bit buffer in a random access memory device for temporary storage of flag bits generated during normal LZSS-based compression. The flag bit buffer stores the flag bits separately from their corresponding pointers and uncompressed data bytes until all input data has been read. Then, the flag bits are appended to the compressed output stream of data. Decompression can be performed much faster because bit manipulation is only required when reading the flag bits and not when reading uncompressed data bytes and pointers. Uncompressed data is read using byte length instructions and pointers are read using word instructions, thus reducing the time required for decompression.

20 Claims, 1 Drawing Sheet

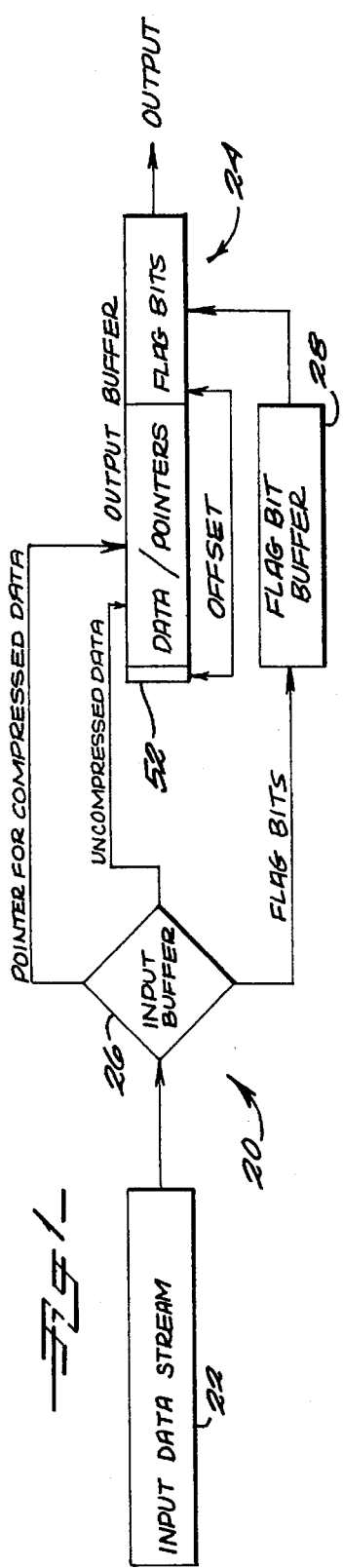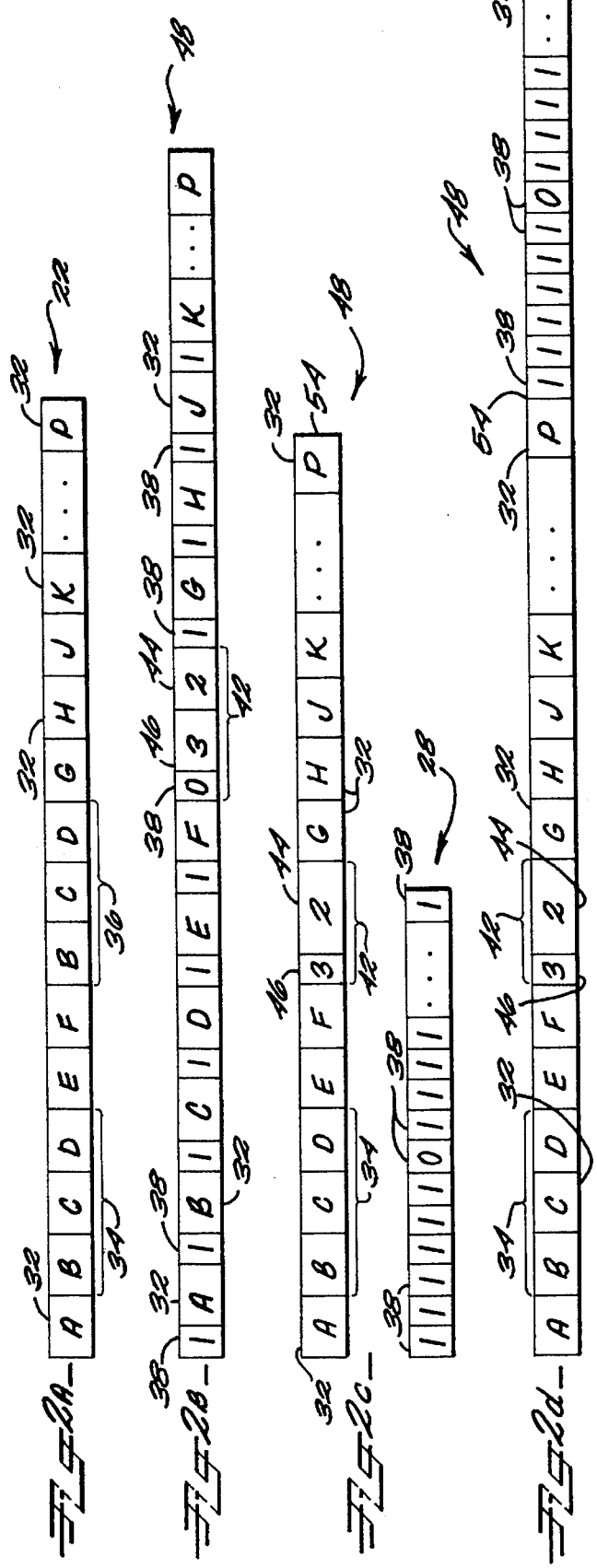

METHOD FOR COMPRESSION OF BINARY DATA

The United States Government has rights in this invention pursuant to Contract No. DE-AC 09-89SR18035 between the U.S. Department of Energy and Westinghouse Savannah River Company.

BACKGROUND OF THE INVENTION

1. Field of the Invention

The present invention relates to methods for compressing digital data. More particularly, the present invention relates to a method for compressing digital data using flag bit partitioning.

2. Discussion of Background

Information processing systems, data transmission systems and the like frequently store large amounts of binary data in a mass memory storage device or transfer binary data from one memory storage device to another. Memory storage devices include tape drives, hard disk drives and other magnetic or optical media, all of which have a limited amount of space. To make more efficient use of the fixed storage capacity of memory storage devices, methods have been developed to "compress" the stream of data before it is stored. "Compressing the data" means that data is not stored literally but rather, where possible, some of the data is replaced with shorter expressions of it. These shorter expressions can be decoded to restore the data to its original, literal condition when the data is brought from storage.

There are two major families of data compression methods. Both of these families are derived from methods developed by Ziv and Lempel. The first family of methods is known as LZ77 and the second family is known as LZ78. Both methods compress the data stream by dividing the input data stream into a sequence of data strings (each string typically being at least one byte in length) and then replacing strings that repeat a previous string with shorter codes to indicate the string that is replaced is a duplicate of its predecessor.

In the LZ78-based compression method a dictionary of data strings is built when the strings are read for the first time. When data strings are encountered a second time, they are then represented in storage by short codes that reference the location of the string in the dictionary. One of the most widely-used LZ78-based compression method is Lempel-Ziv-Welch (referred to as LZW), which is described in U.S. Pat. No. 4,558,302, issued to Welch on Dec. 10, 1985.

In contrast to the dictionary used in LZ78-based methods, LZ77-based compression methods use previously read input data byte strings as the dictionary. Therefore, the codes representing the repeated data byte strings consist of "pointers" that point to matching strings of data bytes, rather than indexes in an independent dictionary. The pointers are an ordered pair of values representing a length and an offset. The length indicates the number of data bytes in the string being repeated while the offset indicates the location of the initial data byte in that string.

In this compression method, the pointer is sometimes longer than the string of data bytes being represented, creating data "expansion" for that string. Consequently, a variation of LZ77-based compression methods was introduced by Storer (see U.S. Pat. No. 4,876,541) and Szymanski to eliminate this problem. In their method, which is known as LZSS, symbols taken directly from the input data stream are used whenever a pointer would be longer than the repeating data string being represented. Also, a flag bit is added to each pointer and each data byte to distinguish them.

Although the LZSS system compresses data into a smaller amount of memory, the addition of flag bits required to distinguish pointers from data bytes causes LZSS-based compression and subsequent decompression to occur more slowly, because the flag bit "bumps" the eighth data bit of each byte to the first position of the next register. In decompressing the data, the bits must be read bit by bit. Thus, there is a need for improving the speed of data manipulation in LZSS-based compression and decompression methods without significantly decreasing the degree of compression.

SUMMARY OF THE INVENTION

According to its major aspects and broadly stated, the present invention is a modified, LZSS-based system, referred to herein as "flag bit partitioning." According to the method of the present invention, a buffer is established for temporarily storing the flag bits that are generated during normal LZSS-based compression. The flag bits are thus stored apart from their corresponding uncompressed data bytes and pointers until all input data have been read. Then, the flag bits are moved from the buffer and appended to the compressed stream of data. A pointer bit is added to identify the portion of the now-compressed data stream that contains bits.

The present invention, being part of an asymmetric compression method, is not so much concerned about the length of time required to compress the data (as are many of the prior art compression methods). Rather, the present invention is more concerned with presenting the compressed data in a form that is conducive to rapid decompression, preferably in applications where multiple decompressions will be made from copies of the compressed data stream, for example, multimedia applications.

Partitioning of the flag bits, or separating them from their corresponding bytes and pointers, is an important feature of the present invention. The bit flags can then be manipulated using bit instructions and the compressed data can be read and written using byte-length or word-length instructions depending on whether the bytes are uncompressed data or pointers. Compressed and uncompressed data are decompressed using word and byte instructions, respectively, thus reducing the time for normal decompression by approximately one half. Therefore, decompression can be performed much faster. In current LZSS systems, the slower bit manipulation is required for decompressing the entire data stream.

Moving the partitioned flag bits to a temporary storage, such as the computer random access memory (RAM) is an important feature of the present invention. Using the RAM to store the flag bits is both convenient and effective because it reduces the amount of manipulation of the data in compression.

Other features and advantages of the present invention will be apparent to those skilled in the art from a careful reading of the Detailed Description of a Preferred Embodiment presented below and accompanied by the drawings.

BRIEF DESCRIPTION OF THE DRAWINGS

In the drawings,

FIG. 1 is a schematic diagram of a compression method according to a preferred embodiment of the present invention;

FIG. 2a is a diagram of a sample input data stream for compression; FIG. 2b is a diagram of a compressed output data stream using normal LZSS-based compression;

FIG. 2c is a diagram of a compressed output dam stream and temporary bit buffer during compression using bit partitioning according to the method of the present invention; and FIG. 2d is a diagram of a compressed output data stream upon completion of compression according to the method of the present invention.

DETAILED DESCRIPTION OF A PREFERRED EMBODIMENT

In the following description similar components are referred to by the same reference numeral in order to simplify the understanding of the sequential aspect of the drawings.

Data "compression" is a metaphor for techniques that "pack" more information in the form of binary data into fewer storage spaces. The compression occurs when repetitive data is replaced with shorter expressions. Therefore, the compression involves reducing the actual amount of data taken from an input device and writing the reduced amount of data to an output device. Data that is compressed must be "decompressible;" that is, data stored in compressed form must be retrievable in the form it was in prior to compression.

The input device typically has an input buffer to receive sequential streams of input data. An input data stream is preferably divided into a series of individual data bytes, each comprised of eight bits. Each group of eight bits, that is, each data byte, may represent one character of text, for example.

Many data compression methods are LZ-based methods, which compress data streams by replacing repeated strings of data bytes with representative codes. In some forms of LZ-based compression, the representative codes are indexed to a dictionary of data byte string entries that is created upon the reading of the input data stream.

LZSS-based compression methods comprise a family of data compression methods that differ slightly from LZ-based compression methods in that the codes, called pointers, which are ordered pairs of values, represent previously read data byte strings, rather than entries in a separate dictionary of previously read data byte strings. Therefore, in LZSS compression, data bytes and pointers occur in the compressed data sequence. Flag bits must be added to each data byte and to each representative code to distinguish the two.

One of the two ordered pairs of values of a pointer is called the length (or "run-length") and it represents the number of data bytes in the string of data bytes being repeated. The other value is called the location, index or "offset" and it represents the position of the initial data byte in the string of data bytes being repeated.

Referring now to FIG. 1, the data compression method 20 in its preferred embodiment is shown schematically. According to the present invention, data from an input data stream 22 is compressed and transferred to an output or storage buffer 24 using an input buffer 26 and a temporary or flag bit buffer 28. The present invention is used in conjunction with LZSS-based or similar compression code, as will be discussed in detail below.

In general, input data stream 22 is transferred into input buffer 26 and then each byte is read sequentially to determine which data is to remain in uncompressed form and which data is to be "compressed", that is, which data is to be represented by a pointer. The remaining data, that is, the uncompressed data, is written directly to output buffer 24 as its corresponding bit flag is written to flag bit buffer 28. Similarly, pointers representing "compressed" data are written to output buffer 24 as their corresponding bit flags are written to flag bit buffer 28.

Once the contents of input buffer 26 have been read completely, the flag bits in flag bit buffer 28 are appended to the data in output buffer 24. Thus, output buffer 24 contains a stream of data in the modified LZSS form with the corresponding flag bits positioned at the end thereof.

Input data stream 22, as discussed previously, may be any series of binary data bytes fed sequentially to input buffer 26. Input buffer 26 can be any storage medium for digital data, such as a hard disk or a magnetic tape drive, but is preferably a portion of the input/output buffer of the input device from which the data is being transferred. For example, input buffer 26 can be a portion of random access memory (RAM) configured especially for input/output operations.

Flag bit buffer 28 is preferably a buffer created temporarily for sequentially storing the flag bits until all of the data bytes from input buffer 26 have been read, at which time the contents of flag bit buffer 28 are appended to output buffer 24. Flag bit buffer 28 is an additional buffer that is not part of any other LZSS-based compression methods.

Flag bit buffer 28 is preferably also created in a portion of RAM but can be established, for example, using a portion of input buffer 26 or output buffer 24. Also, flag bit buffer 28 may be established in a portion of the input/output buffer of the input or data transferring device, or from any other location dictated by the application.

The size of flag bit buffer 28 should be roughly proportional to the size of the input buffer 26. Since LZSS-based compression methods generate a 1-bit flag (either set to 1 or cleared to 0) for each data byte (assuming 8 bits per byte) read from input buffer 26, the size of the flag bit buffer 28 must be at least approximately one eighth the size of input buffer 26.

As shown in FIG. 1, input data stream 22 is transferred to input buffer 26. This transfer can be performed in any convenient manner known in the prior art for transferring digital data. For example, input buffer 26 may be connected to a serial register (not shown) so that input data stream 22 will be loaded into input buffer 26 serially. Alternatively, parallel registers (not shown) may be used to load input data stream 22 into input buffer 26. Data compression begins after the input data stream 22 has been loaded into input buffer 26.

In FIG. 2a, a sample version of input data stream 22 is shown. Input data stream 22 preferably comprises a series of data bytes 32, each of which is represented in FIG. 2a by a letter of the alphabet. For most streams of digital data, each data byte 32 is comprised of eight bits and represents a text character, such as a letter or other keyboard symbol, or other equivalent unit. As an example of an equivalent unit, one data byte might represent the integer portion of a number and the immediately following data byte may represent the fractional portion of that same number.

Because input data stream 22 is read sequentially during compression, data bytes 32 form a plurality of data byte strings of varying length. For example, data bytes B, C and D form a three-byte data string BCD (shown generally as 34) in byte positions 2–4 of input data stream 22. Similarly, bytes D, G, H, J and K form a five-byte data string in byte positions 9–13 of input data stream 22.

In the sample version of input data stream 22 shown in FIG. 2a, it can be seen that data string BCD 34 in byte positions 2–4 is repeated in byte positions 7–9 (shown generally as 36). It is these two byte strings that will be used to demonstrate LZSS-based compression alone and in conjunction with the present invention.

Using normal LZSS-based or similar compression methods, input data stream 22 is compressed into a form shown, for example, in FIG. 2b. In LZSS-based compression methods, a flag bit 38 is added before each data byte 32 and before each pointer (shown as 42) in order to distinguish them from one another. Typically, but depending on the specific LZSS-based compression used, each flag bit 38 is set to "1" to identify the byte that follows as a data byte 32 or cleared to "0" to identify the following two bytes as a pointer 42.

In operation, using normal LZSS-based compression, the data byte 32 in position 1 ("A") of input data stream 22 is read. Because "A" in position 1 is not part of a repeated data string and is therefore to be an uncompressed data byte, a set-flag bit 38 is written to output buffer 24 and then "A" is written to output buffer 24 using bit move instructions. Next, the data byte 32 in position 2 ("B") is read. Because "B" in position 2 is not part of a repeating data string, it is written directly to output buffer 24 (as an uncompressed data byte) with a set-flag bit 38 written therebefore. Then, the data byte 32 in position 3 is read. In this manner, each data byte 32 within input data stream 22 is read byte-by-byte.

For the particular sample of data bytes 32 in input data stream 22, the compression method continues as just described until the data byte 32 in position 7 is read. When the data byte 32 in position 7 ("B") is read, the compressor determines that "B" duplicates a previously read data byte 32 (specifically, "B" in position 2). Because of this, the data byte positions immediately following position 7 are read to determine if a string of data bytes beginning with position 7 repeats a previously read data byte string and, if so, how many data bytes are contained within the strings.

Such comparison routines can be performed in a number of ways and depend upon the specific LZSS-based compression in use. Usually, searching routines employing the notion of a sliding or fixed-length window are used to compare data bytes 32 for matching strings. Other methods known in the art include the use of a separate dictionary of previously read data bytes 32 and the use of hashing techniques and the like. Again, the matching algorithm employed depends on the particular compression method in use.

Using input data stream 22 as shown in FIG. 2a, the compressor will determine that data bytes "B", "C" and "D" in positions 7–9 comprise a 3-byte string 36 (BCD) that repeats an earlier 3-byte string 34 (BCD in positions 2–4). Therefore, a clear-flag bit 38 is written to output buffer 24 followed by pointer 42, which is written in a form that represents the 3-byte string 36 (BCD) found in positions 7–9. The clear-flag bit ("0") is used to distinguish pointer 42 from the remaining uncompressed data bytes 32, which follow set-flag bits ("1") in output buffer 24.

Pointer 42 preferably consists of an offset 44 and a run-length 46 that are collectively the length of two data bytes. However, pointer 42 may be of a different size depending on the specific LZSS-based compression method being used. In this example, the offset portion 44 of pointer 42 is written as the value "2" to represent the data byte position of the initial data byte ("B") contained in the data byte string 34 being repeated (BCD in positions 2–4). The run-length portion 46 of pointer 42 is written as the value "3" to indicate that the data byte string 34 being repeated (BCD) is three bytes long. Thus, in this manner, data byte string 36 (BCD) in positions 7–9 of input data stream 22 is represented by pointer 42 as "32". However, it is understood that pointer 42 can be configured differently as long as it contains the necessary information. Such variations on the contents of pointer 42 exist among different LZSS-based compression methods.

After pointer 42 is written to output buffer 24, the data byte "G" in position 10 of input data stream 22 is read. Accordingly, a set-flag bit 38 is written to output buffer 24 followed by the data byte "G" because "G" in position 10 of input data stream 22 is not part of a repeating data string. Each remaining position of input data stream 22 is read sequentially in the manner just described until all of input data stream 22 has been read for possible compression.

The compressed stream of data according to prior art LZSS-based compression methods, shown as 48 in FIG. 2b, consists of a flag bit 38 followed by either a data byte 32 (an uncompressed data byte) or a pointer 42 representing a compressed string of data bytes. That is, flag bits 38 set to "1" are followed by a data byte expressed in uncompressed form and flag bits 38 set to "0" are followed by a pointer (usually the next two bytes) that expresses a repeating data byte string in the form of an offset and a run-length.

The compressed data stream 48 shown in FIG. 2b reduces the overall amount of data when compared with its original form because pointers 42 are used to represent repeating data byte strings 36 (note that FIGS. 2a, 2b are not drawn to scale—each data byte 32 is preferably eight bits in length while each flag bit 38 is only 1 bit in length—and, in this example, only one 3-byte string is shown being compressed). However, compressed data stream 48, which is the result of normal LZSS-based compression, is not in a form that is conducive to rapid decompression, namely because of the presence of flag bits interleaved in a series of bytes. As a result, decompression of compressed data stream 48 requires bit-by-bit manipulations to read flag bits 38, data bytes 32 and pointers 42. Since each of data bytes 32 and pointers 42 are byte-sized (8 bits per byte), reading them bit-by-bit is unduly burdensome for a decompressor and is extremely time consuming.

According to the present invention, the flags bits 38 created as part of LZSS-based compression methods are "partitioned," or separated, from the data stream during compression and then added to the end of the compressed data stream in output buffer 24. Thus, during decompression, the flag bits 38 can be read using bit instructions while the uncompressed data bytes 32 and pointers 42 can be read using byte or word instructions. Using byte or word instructions for the data bytes 32 and pointers 42, rather than bit instructions, reduces decompression time by approximately one half.

As stated previously, the present invention can be used with any LZSS-based or similar compression method as long as the method creates flag bits for identifying data bytes and pointers in the compressed data stream. The present method involves establishing flag bit buffer 28, as discussed previously, and slightly modifying the method of the particular LZSS-based compression method selected.

The first modification involves allocating a portion (shown generally as 52 in FIG. 1) of the beginning of output buffer 24, preferably the first four bytes. Because bit flags 38 will be written to flag bit buffer 28 temporarily and then appended to compressed data stream 48 contained in output buffer 24, allocated portion 52 is needed to hold the start location of flag bits 38 within output buffer 24 once flag bits 38 have been written to output buffer 24 it so that flag bits 38 can be located for decompression.

The next modification of the present invention requires altering the compression method so that flag bits 38 are set and cleared in flag bit buffer 28 rather than in output buffer 24. Also, the compression method needs to be altered to write uncompressed data bytes 32 to output buffer 24 using byte move instructions rather than bit move instructions. The byte move instructions are similar to bit move instructions except that byte instructions manipulate 8 bits (1 byte) at a time rather than 1 bit.

One additional modification by the present invention requires that the contents of each pointer 42 be configured so that the ordered pair (offset and nut-length) is written as a two byte (2×8 bits=16 bit) word. Each pointer 42 is then written to output buffer 24 using an integer move instruction. Integer move instructions are standard move instructions used to manipulate integers or other data represented by two data bytes and are well known those of ordinary skill in the art of data manipulation.

Referring now to FIGS. 2a and 2c, in operation, using the present invention, data byte 32 in position 1 ("A") of input data stream 22 is read. Because "A" in position 1 is not part of a repeated data string and is therefore to be an uncompressed data byte, a set-flag bit 38 ("1") is written to flag bit buffer 28, rather than output buffer 24, and then "A" is written as a remaining uncompressed data byte 32 to output buffer 24 using a byte move instruction. Next, data byte 32 in position 2 ("B") is read. Because "B" in position 2 is not part of a repeated data string, a set-flag bit 38 is written to flag bit buffer 28 and "B" is written directly to output buffer 24 as a remaining uncompressed data byte 32. Then, the data byte 32 in position 3 is read. In this manner, each data byte 32 in input data stream 22 is read byte-by-byte.

When data byte 32 in position 7 ("B") is read, the compressor, as modified by the present invention, determines that "B" in position 7 duplicates a previously read data byte 32 (specifically, "B" in position 2). Therefore, the data byte positions immediately following position 7 are read to determine if a string of data bytes beginning at position 7 repeats a previously read data byte string and, if so, how many data bytes are contained within that string.

As shown before, data bytes "B", "C" and "D" in positions 7–9 comprise a 3-byte string 36 (BCD) that repeats an earlier 3-byte string 34 (BCD in positions 2–4). Therefore, a clear-flag bit 38 ("0") is written to flag bit buffer 28 using a bit clear instruction and a corresponding pointer 42 is written to output buffer 24 using an integer-length (two bytes) move instruction.

Preferably, pointer 42 is two bytes (16 bits) long, with the run-length 46 occupying the first 4 bits of the 16-bit space and the offset 44 occupying the last 12 bits of the 16-bit space. Thus, in this sample, the pointer is "32", indicating that the data string 34 being repeated is 3 bytes in length and begins at position 2.

It will be understood that various LZSS-based compression methods use different schemes for configuring the contents of pointers 42 because there are a number of different ways to represent repeated strings. For example, a reverse index or offset could be used to indicate the number of data bytes that exist between the first dam byte of the repeating data byte string and the first byte of the repeated byte string. Here, the reverse index offset would be given a value of "5" to indicate that "B" in position 7 is 5 byte positions away from "B" in position 2.

After pointer 42 is written to output buffer 24, data byte 32 in position 10 ("G") of input data stream 22 is read. As in previous operations, a set-flag bit 38 is written to flag bit buffer 28 and "G" is written directly to output buffer 24 as an uncompressed data byte 32 because "G" in position 10 of input data stream 22 is not part of a repeating data string. Each remaining position of input data stream 22 is read sequentially in this manner until all data bytes 32 of input data stream 22 have been read for possible compression.

After all data bytes 32 in input data stream 22 have been read, the end location (shown generally as 54) of the compressed data stream 48 contained in output buffer 24 is written into reserved portion 52 (see FIG. 1) of output buffer 24. Then, the size of flag bit buffer 28 is determined and the contents of flag bit buffer 28 are appended to compressed data stream 48 in output buffer 24 at end location 54, resulting in the data stream 48 as shown in FIG. 2d. Thus, end location 54 represents the offset of flag bits 38 once they have been written to output buffer 24. Such offset is needed for subsequent decompression.

Because of the format of compressed data stream 48 resulting from the use of the present invention, decompression can be performed much more rapidly than previous LZSS-based decompression. According to the present invention, decompression is achieved by modifying the decompression method to correspond to modifications made to the compression code method.

During decompression, the compressed data stream 48, as shown in FIG. 2d, is now the input stream to the decompressor and output buffer 24 is a temporary storage buffer. To decompress this stream, the starting location 54 of the appended flag bit 38 is determined and flag bits 38 are parsed bit-by-bit to drive the decompressor. This is the only bit manipulation required. Also, unlike the temporary flag bit buffer 28 needed for compression, no additional buffer is needed here because flag bits 38 are located at the bottom (or end) of the new input buffer (which receives compressed data stream 48 directly from output buffer 24).

The uncompressed data bytes 32 are written from compressed data stream 48 (contained in output or storage buffer 24) directly to the new output buffer (not shown) using byte move instructions. Similarly, pointers 42 are read from compressed data stream 48 using a word (two bytes) move instructions, and decomposed into the offset 44 and run-length 46. Using this information, the repeated data string 34 is copied to the new output buffer (not shown) using byte move instructions. As a result of decompression in this manner, decompression time is reduced by approximately one half compared with conventional decompression methods used with LZSS-based compression.

It will be apparent to those skilled in the art that many changes and substitutions can be made to the preferred embodiment herein described without departing from the spirit and scope of the present invention as defined by the appended claims.

What is claimed is:

1. A method for compressing an input stream of data being transferred from an input buffer to an output buffer, said input data stream composed of a series of data bytes including at least one repeated data byte that repeats a previous data byte in said series of data bytes, said method comprising the steps of:

reading each data byte in said series of data bytes;

determining whether said each data byte is a repeated data byte;

replacing said repeated data byte by a pointer that indicates the location of said previous data byte, said series of data bytes then containing pointers and remaining data bytes;

establishing a flag bit for said repeated byte;

storing temporarily said flag bit in a flag bit buffer;

writing said remaining data bytes and said pointers to said output buffer as an output series of data bytes; and writing said flag bit from said temporary flag bit buffer to said output buffer at the end of said output series.

2. The method as recited in claim 1, wherein said series of data bytes has a plurality of repeated data bytes and wherein said method further comprises the step of allocating a portion of said output buffer for all established flag bits.

3. The method as recited in claim 2, wherein said pointers are read and written using integer move instructions.

4. The method as recited in claim 1, wherein said remaining data bytes are read and written using byte move instructions.

5. The method as recited in claim 1, wherein said pointers are read and written using integer move instructions.

6. The method as recited in claim 1, wherein said temporary flag bit buffer is in a random access memory device.

7. A method for managing an input data stream received from an input buffer, said method for use with a storage buffer and an output buffer, said input data stream composed of a series of data bytes including at least one string of repeated data bytes, said at least one string of repeated data bytes repeating a previous data byte string in said series of data bytes, and said method comprising the steps of:

reading each data byte in said series of data bytes;

determining whether said each data byte is part of a repeated data byte string;

replacing said repeated data byte string by a pointer that indicates the location and run length of said previous data byte string, said series of data bytes then containing pointers and remaining data bytes;

establishing a first flag bit for said repeated data byte string and a second flag bit for each remaining data byte;

storing temporarily in a flag bit buffer said first and said second flag bits in the order in which they were established;

writing said remaining data bytes and said pointers to said storage buffer as an output series of data bytes; and writing said flag bit from said temporary flag bit buffer to said storage buffer at the end of said output series.

8. The method as recited in claim 7, further comprising the step of reserving a portion of said output buffer.

9. The method as recited in claim 7, wherein said pointer indicates said location of said previous data byte string by the number of data bytes between said previous data string and said repeating data byte string.

10. The method as recited in claim 7, further comprising the steps of:

reading said output series with said flag bits;

identifying each pointer in said output series using said flag bits;

locating each previous data byte string from each pointer;

replacing each pointer with said previous data byte string to form, in sequence with said data bytes, a restored series of data bytes equivalent to said series of data bytes; and writing said restored series of data bytes to said output buffer.

11. The method as recited in claim 10, wherein said data bytes are read and written using byte move instructions.

12. The method as recited in claim 10, wherein said pointers are read and written using word move instructions.

13. The method as recited in claim 10, wherein said flag bits are read and written using bit instructions, said pointers are read and written using word move instructions and said data bytes are read and written using byte move instructions.

14. The method as recited in claim 7, wherein said first flag bit is a set flag bit and said second flag bit is a clear flag bit.

15. The method as recited in claim 7, further comprising the step of reserving a portion of said storage buffer for said flag bits.

16. The method as recited in claim 7, wherein said temporary flag bit buffer is in a random access memory device.

17. The method as recited in claim 7, wherein said flag bit buffer is no more than approximately one eighth the size of said input buffer.

18. A method for managing an input data stream received from an input buffer, said method for use with a storage buffer and an output buffer, said input data stream composed of a series of data bytes including at least one string of repeated data bytes, said at least one string of repeated data bytes repeating a previous data byte string in said series of data bytes, and said method comprising the steps of:

reading each data byte in said series of data bytes;

determining whether said each data byte is part of a repeated data byte string;

replacing said repeated data byte string by a pointer that indicates the location and run length of said previous data byte string, said series of data bytes then containing pointers and remaining data bytes;

establishing a first flag bit for said repeated data byte string and a second flag bit for each remaining data byte;

storing temporarily in a flag bit buffer said first and said second flag bits in the order in which they were established;

writing said remaining data bytes and said pointers to said storage buffer as an output series of data bytes;

writing said flag bit from said temporary flag bit buffer to said storage buffer at the end of said output series;

reading said output series with said flag bits;

identifying each pointer in said output series using said flag bits;

locating each previous data byte string from each pointer;

replacing each pointer with said previous data byte string to form, in sequence with said data bytes, a restored series of data bytes equivalent to said series of data bytes; and writing said restored series of data bytes to said output buffer.

19. The method as recited in claim 18, wherein said data bytes are read and written using byte move instructions.

20. The method as recited in claim 18, wherein said pointers are read and written using word move instructions.

* * * * *